US012690241B2

(12) United States Patent
Liu et al.

(10) Patent No.: US 12,690,241 B2
(45) Date of Patent: Jul. 21, 2026

(54) SEMICONDUCTOR STRUCTURE AND METHODS FOR MANUFACTURING THE SAME

(71) Applicant: Vanguard International Semiconductor Corporation, Hsinchu (TW)

(72) Inventors: Tse-Hsiao Liu, Hsinchu City (TW); Chih-Wei Lin, Zhubei City (TW); Po-Hao Chiu, Zhunan Township (TW); Pi-Kuang Chuang, Hsinchu City (TW); Ching-Yi Hsu, Hsinchu City (TW)

(73) Assignee: VANGUARD INTERNATIONAL SEMICONDUCTOR CORPORATION, Hsinchu (TW)

( * ) Notice: Subject to any disclaimer, the term of this patent is extended or adjusted under 35 U.S.C. 154(b) by 772 days.

(21) Appl. No.: 17/967,337

(22) Filed: Oct. 17, 2022

(65) Prior Publication Data

US 2024/0128313 A1     Apr. 18, 2024

(51) Int. Cl.
*H10D 62/10* (2025.01)
*H10D 64/01* (2025.01)
(Continued)

(52) U.S. Cl.
CPC .......... *H10D 62/102* (2025.01); *H10D 64/01* (2025.01); *H10D 64/015* (2025.01);
(Continued)

(58) Field of Classification Search
CPC .. H10D 64/685; H10D 64/516; H10D 62/102; H10D 64/68
See application file for complete search history.

(56) References Cited

U.S. PATENT DOCUMENTS 5,460,998 A * 10/1995 Liu ..................... H10D 84/038
438/231
6,077,743 A * 6/2000 Chen ..................... H10D 1/043
438/398
(Continued)

FOREIGN PATENT DOCUMENTS

CN 112802902 A * 5/2021 ............. H10D 30/60
CN 114141709 A * 3/2022 .......... H10D 84/856
TW 201806035 A * 2/2018

*Primary Examiner* — Joseph C. Nicely
(74) *Attorney, Agent, or Firm* — Birch, Stewart, Kolasch & Birch, LLP

(57) ABSTRACT

A method includes providing a substrate, forming a patterned hard mask layer over the substrate, etching the patterned hard mask layer to form a hole that penetrates the patterned hard mask layer, forming a barrier portion in the hole, removing the patterned hard mask layer, and forming a gate structure over the substrate. Formation of the gate structure includes forming a dielectric body portion on the substrate. The barrier portion that is thicker than the dielectric body portion adjoins one end of the dielectric body portion. The dielectric body portion and the barrier portion are collectively referred to as a gate dielectric layer. Formation of the gate structure further includes forming a gate electrode on the gate dielectric layer and forming gate spacers on opposite sidewalls of the gate electrode. During formation of the gate spacers, a portion of the barrier portion is removed to form a recessed corner.

19 Claims, 10 Drawing Sheets

(51) Int. Cl.

| | | |
|---|---|---|
| *H10D 64/27* | (2025.01) | |
| *H10D 64/68* | (2025.01) | |
| *H10W 10/00* | (2026.01) | |
| *H10W 10/17* | (2026.01) | |

(52) U.S. Cl.

CPC ......... *H10D 64/018* (2025.01); *H10D 64/021* (2025.01); *H10D 64/516* (2025.01); *H10D 64/68* (2025.01); *H10W 10/014* (2026.01); *H10W 10/17* (2026.01)

(56) References Cited

U.S. PATENT DOCUMENTS

| | | | | |
|---|---|---|---|---|
| 6,316,304 | B1 * | 11/2001 | Pradeep ............. | H10D 84/0147 |
| | | | | 438/303 |
| 11,094,817 | B2 * | 8/2021 | Wu ........................ | H10D 30/65 |
| 2001/0033006 | A1 * | 10/2001 | Heineck ............... | H10D 64/516 |
| | | | | 257/E21.654 |
| 2006/0194393 | A1 * | 8/2006 | Muto ................. | H10D 84/0188 |
| | | | | 257/E21.639 |
| 2007/0212838 | A1 * | 9/2007 | Ivanov ................. | H10D 30/603 |
| | | | | 257/E29.054 |
| 2009/0039444 | A1 * | 2/2009 | Suzuki ................. | H10D 62/151 |
| | | | | 257/E27.06 |
| 2011/0278665 | A1 | 11/2011 | Hébert | |
| 2015/0287797 | A1 * | 10/2015 | Yu ........................ | H10D 64/516 |
| | | | | 438/305 |
| 2016/0079380 | A1 * | 3/2016 | Tseng ................... | H10D 64/516 |
| | | | | 257/401 |
| 2017/0207127 | A1 * | 7/2017 | Li ...................... | H10D 84/0142 |
| 2018/0374838 | A1 * | 12/2018 | Huang ................. | H10D 62/151 |
| 2022/0102518 | A1 * | 3/2022 | Chen .................... | H10D 64/516 |
| 2023/0207647 | A1 * | 6/2023 | Tsai ..................... | H10D 30/601 |
| | | | | 257/288 |

* cited by examiner

SEMICONDUCTOR STRUCTURE AND METHODS FOR MANUFACTURING THE SAME

BACKGROUND

Technical Field

The disclosure relates to a semiconductor structure and methods for manufacturing the same, and it relates to a semiconductor structure that includes a barrier portion and methods for manufacturing the same.

Description of the Related Art

In recent years, the development of semiconductor devices for use in computers, consumer electronics and other fields has progressed rapidly. Currently, semiconductor device technology has been widely accepted in Metal-Oxide-Semiconductor Field-Effect Transistor (MOSFET) products that have a high market share. Semiconductor devices are used in a variety of electronic applications, such as high-power devices, personal computers, cell phones, digital cameras, and other electronic devices. These semiconductor devices are typically fabricated by depositing insulating layers or dielectric layers, conductive layer materials, and semiconductor layer materials on a semiconductor substrate, followed by patterning the various material layers by using photolithography processes. Therefore, the circuit devices and components are formed on the semiconductor substrate.

However, as the functional density of semiconductor devices continuously increases, the complexity of processing and manufacturing these semiconductor devices also increases. For example, during the operation of the semiconductor device, a high-intensity of electric field is generated at the edge of the substrate that is adjacent to the gate electrode, thereby affecting the electrical performance of the semiconductor device. Although existing semiconductor structures and methods for manufacturing the same have been adequate for their intended purposes, they have not been entirely satisfactory in all respects. Therefore, up to the present, there are still some problems to be overcome in regards to semiconductor integrated circuits and technology to improve semiconductor structures and methods for manufacturing the same.

SUMMARY

Some embodiments of the present disclosure provide methods for manufacturing a semiconductor structure. A method for manufacturing a semiconductor structure includes providing a substrate having a first conductivity type. The method includes forming a patterned hard mask layer over the substrate. The method includes etching the patterned hard mask layer to form a hole that penetrates at least the patterned hard mask layer. The method includes forming a barrier portion in the hole. The method includes removing the patterned hard mask layer. The method includes forming a well region in the substrate. The well region has a second conductivity type and is disposed corresponding to the barrier portion. The method includes forming a gate structure over the substrate. Formation of the gate structure over the substrate includes forming a dielectric body portion on the substrate. The barrier portion adjoins one end of the dielectric body portion. The thickness of the barrier portion is greater than the thickness of the dielectric body portion. The dielectric body portion and the barrier portion are collectively referred to as a gate dielectric layer. A gate electrode is formed on the gate dielectric layer. Gate spacers are formed on opposite sidewalls of the gate electrode. A portion of the barrier portion is removed to form a barrier portion with a recessed corner.

Some embodiments of the present disclosure provide semiconductor structures. A semiconductor structure includes a substrate having a first conductivity type; a well region in the substrate and having a second conductivity type; a gate dielectric layer over the substrate; and a gate electrode on the gate dielectric layer. The gate dielectric layer includes a body portion extending on the substrate and having a first thickness, and a barrier portion adjoining one end of the body portion and having a second thickness. The second thickness is greater than the first thickness, and the barrier portion has a recessed corner.

A detailed description is given in the following embodiments with reference to the accompanying drawings.

BRIEF DESCRIPTION OF THE DRAWINGS

The embodiments of the disclosure can be more fully understood by reading the subsequent detailed description and examples with references made to the accompanying drawings. For clarity of illustration, various elements in the drawings may not be drawn to scale, wherein.

DETAILED DESCRIPTION

Figures 1A, 1B:
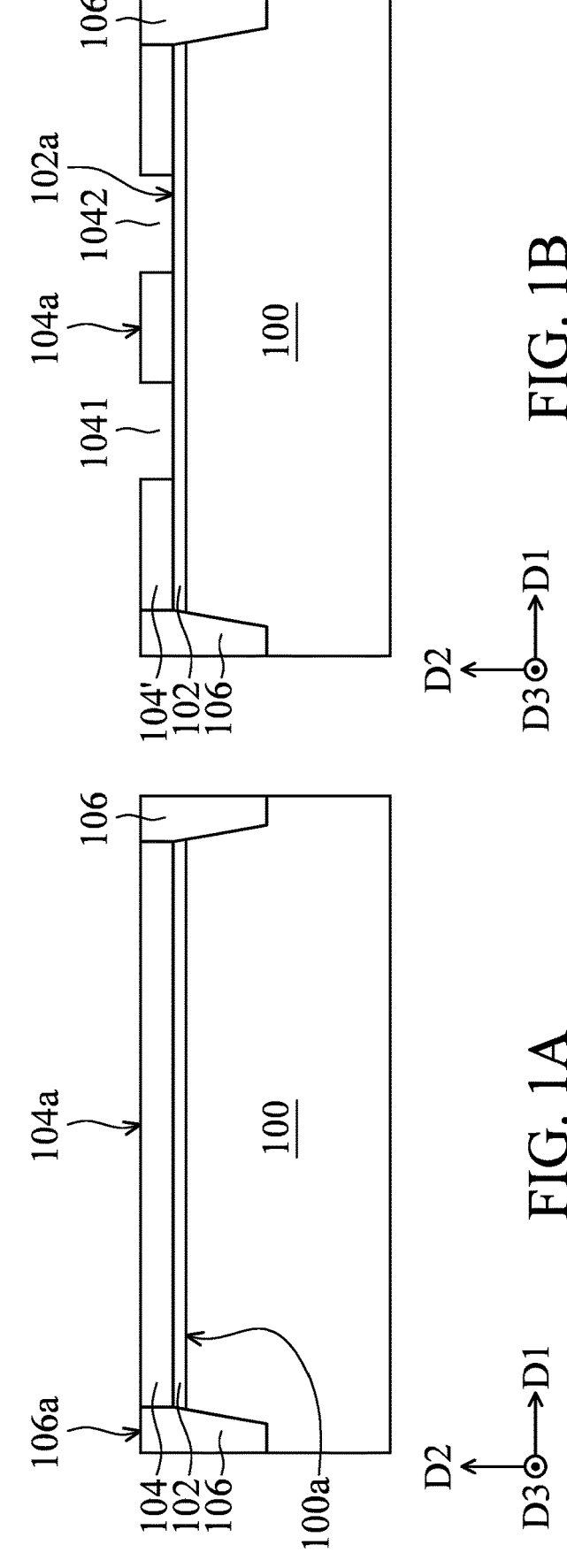
FIG. 1A, FIG. 1B, FIG. 1C, FIG. 1D, FIG. 1E, FIG. 1F, FIG. 1G and FIG. 1H illustrate cross-sectional views of intermediate stages of a method for manufacturing a semiconductor structure in accordance with some embodiments of the present disclosure.

The following description provides various embodiments, or examples, for implementing different features of the present disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numbers and/or letters in the various examples. This repetition is for the purpose of simplicity and clarity and does not in itself dictate a relationship between the various embodiments and/or configurations discussed.

Furthermore, spatially relative terms, such as "beneath", "below", "lower", "above", "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Some embodiments are described below. Throughout the various views and illustrative embodiments, similar reference numbers are used to designate similar features/components. It should be understood that additional operations can be provided before, during, and after the method, and some of the operations can be replaced or eliminated for other embodiments of the method.

Embodiments provide semiconductor structures and methods for manufacturing the same. In some embodiments, a gate dielectric layer with one or more barrier portions is fabricated by a patterned hard mask layer that is used to form isolation structures (such as shallow trench isolation structures). Therefore, there is no need to provide an additional mask layer to form the barrier portion(s) of the embodiments. In addition, the manufacturing methods of the embodiments do not affect the thermal budget of the semiconductor structure in which each doping region has stable diffusion region. In addition, during operation of the semiconductor structure, the high electric field intensity that is typically generated at the edge of the substrate adjacent to the gate electrode can be reduced by the barrier portion(s), in accordance with some embodiments of the present disclosure, thereby improving the breakdown voltage of the semiconductor structure. Accordingly, the electrical performance of the semiconductor structure can be effectively improved.

The embodiments can be applied to metal-oxide-semiconductor (MOS) devices, in particular, high-voltage metal-oxide-semiconductor (HV MOS) devices such as high-voltage metal-oxide-semiconductor field effect transistors (HV MOSFETs). In some of the embodiments described below, a high-voltage double-diffused-drain metal-oxide-semiconductor field effect transistor (HV DDD MOSFET) is used to illustrate a semiconductor structure. However, the present disclosure is not limited thereto. Some embodiments of the present disclosure can be applied to other types of semiconductor structures.

FIG. 1A-FIG. 1H illustrate cross-sectional views of intermediate stages of a method for manufacturing a semiconductor structure in accordance with some embodiments of the present disclosure.

Referring to FIG. 1A, a substrate 100 is provided according to some embodiments. In some embodiments, the substrate 100 is a bulk semiconductor substrate, such as a semiconductor wafer. For example, the substrate 100 is a silicon wafer. The substrate 100 may include silicon or other elemental semiconductor materials, such as germanium (Ge). In some embodiments, the substrate 100 is a silicon substrate, an epitaxial silicon substrate, a silicon germanium (SiGe) substrate, or a silicon carbide (SiC) substrate. In some embodiments, the substrate 100 is a single-layer structure or a multilayer structure that includes one or more semiconductor materials, insulation materials, conductive materials, or a combination thereof. For example, the substrate 100 may be formed of at least one semiconductor material selected from the group consisting of Si, Ge, SiGe, GaP, GaAs, SiC, SiGeC, InAs, and InP. In some other embodiments, the substrate 100 includes multiple layers of materials, such as Si/SiGe, Si/SiC. In some embodiments, the substrate 100 also includes a silicon-on-insulator (SOI) layer. In some embodiments, the SOI substrate is formed by using an oxygen implanted isolation (SIMOX) process, a wafer bonding process, another suitable method, or a combination thereof. In some embodiments, the substrate 100 includes an insulator material, such as an organic insulator, an inorganic insulator, or a combination of the foregoing materials to form a single-layer structure or a multilayer structure. In some other embodiments, the substrate 100 includes a conductive material, such as polysilicon, metal, alloy, or a combination of the foregoing materials to form a single-layer structure or a multilayer structure. In addition, in some embodiments, the substrate 100 is a substrate doped with the first conductivity type dopants. The first conductivity type is, for example, but not limited to, p-type. In this exemplified embodiment, a substrate 100 having a p-type conductivity is provided.

In some embodiments, a patterned hard mask layer 104 is formed over the substrate 100. The patterned hard mask layer 104 has a first pattern for forming the isolation structures 106 in the substrate 100 in the subsequent process. The patterned hard mask layer 104 may include a single material layer or multiple material layers. A single layer of the patterned hard mask layer 104 is depicted in the drawings for the sake of simplicity and clarity.

In some embodiments, the patterned hard mask layer 104 includes a nitrogen-containing hard mask layer, a carbon-containing hard mask layer, a metal oxide hard mask layer, a metal nitride hard mask layer, or another hard mask layer that includes one or more suitable materials. In some examples, the patterned hard mask layer 104 includes silicon nitride, silicon oxynitride, titanium nitride (TiN), tungsten carbide (WC), another suitable material, or a combination thereof. In this exemplified embodiment, the patterned hard mask layer 104 is a silicon nitride hard mask layer. In some embodiments, the patterned hard mask layer 104 can be formed by one or more deposition techniques, such as a chemical vapor deposition (CVD) process, a physical vapor deposition (PVD) process, an atomic layer deposition (ALD) process, another suitable method, or a combination thereof, to deposit a hard mask material (not shown) over the substrate 100. Then, the foregoing hard mask material is patterned by an appropriate lithography patterning process and an etching process to form the patterned hard mask layer 104. In some embodiments, the lithography patterning process includes photoresist (not shown) coating (for example, spin-coating), soft baking, mask alignment, exposure, post-exposure baking, photoresist development, cleaning and drying (for example, hard baking), another suitable process, or a combination thereof. The etching process includes a dry etching process or a wet etching process. Afterwards, the underlying substrate 100 may be patterned according to the first pattern of the patterned hard mask layer 104 to form trenches (not shown) in the substrate 100.

In some embodiments, a pad oxide layer 102 is further formed on the substrate 100. As shown in FIG. 1A, the pad oxide layer 102 is formed on the top surface 100a of the substrate 100, and the patterned hard mask layer 104 is formed on the pad oxide layer 102. In this exemplified embodiment, the pad oxide layer 102 and the substrate 100 that are positioned under the patterned hard mask layer 104 are patterned according to the patterned hard mask layer 104 by one or more etching processes, thereby forming trenches (not shown) in the substrate 100.

The above-mentioned etching process for forming the trenches may include a dry etching process, a wet etching process, a reactive ion etching (RIE) process, another suitable process, or a combination of the foregoing processes. In some embodiments, after the trenches are formed, any suitable process, such as an ashing process and/or a resist stripping process, is performed to remove the photoresist overlying the patterned hard mask layer 104.

Next, the trenches are filled with an insulating material (not shown) to form the isolation structures 106, so as to define active regions of the substrate 100, in accordance with some embodiments of the present disclosure. The insulating material may include oxides, nitrides, the like, or a combination thereof. In one example, the insulating material includes silicon oxide. In addition, the insulating material can be deposited over the patterned hard mask layer 104 and filled into the trenches by a high density plasma chemical vapor deposition (HDP-CVD) process or another suitable method. Then, an excess portion of the insulating material is removed, such as by a planarization process. The aforementioned planarization process may include a chemical mechanical polishing (CMP) process, an etching-back process, another suitable process, or a combination of the foregoing processes. In some embodiments, the top surface 104a of the patterned hard mask layer 104 is exposed after the planarization process is performed. That is, the patterned hard mask layer 104 can be referred to as a stop layer for the planarization process. Therefore, as shown in FIG. 1A, the top surfaces 106a of the isolation structures 106 are level with the top surface 104a of the patterned hard mask layer 104, in accordance with some embodiments of the present disclosure.

In some embodiments, the isolation structures 106 are, for example, shallow trench isolation structures (shallow trench isolations; STIs) to define the active regions of the semiconductor structure. The well region (such as the first well region 111 and the second well region 112 as shown in FIG. 2D), the gate dielectric layer GD (FIG. 2G) and the gate electrode 116 (FIG. 2G) that are formed in the subsequent processes are surrounded by the isolation structures 106.

In addition, although the isolation structures 106 each configured as a single-layered structure is depicted in this example, the present invention is not limited thereto. In some embodiments, multiple layers of insulating material can be used to form the isolation structures 106. For example, a liner (not shown) may be conformally formed on the patterned hard mask layer 104 and along the sidewalls and the bottom surfaces of the trenches, in accordance with some embodiments of the present disclosure. In some embodiments, the insulating material as described above is then deposited to fill up the trenches, and excess portions of the insulating material and the liner are removed to form the isolation structures 106.

Next, referring to FIG. 1B, in some embodiments, a patterning step is performed on the patterned hard mask layer 104 again, so as to form the patterned hard mask layer 104'. The patterned hard mask layer 104', for example, has a second pattern. The second pattern is different from the first pattern that is used to form the isolation structures 106. In some embodiments, the patterned hard mask layer 104 is etched, so that the patterned hard mask layer 104' includes at least one hole to expose the underlying pad oxide layer 102. In the subsequent process, a barrier portion with a sufficient thickness will be formed through the hole to serve as a part of a gate dielectric layer of the semiconductor structure.

In this exemplified embodiment, the holes 1040 of the patterned hard mask layer 104' include a first hole 1041 and a second hole 1042. The first hole 1041 and a second hole 1042 are separated from each other by a distance in the first direction D1. In addition, the first hole 1041 and the second hole 1042 penetrate through the patterned hard mask layer 104' and expose the pad oxide layer 102 beneath the patterned hard mask layer 104'.

Figures 1C, 1D:
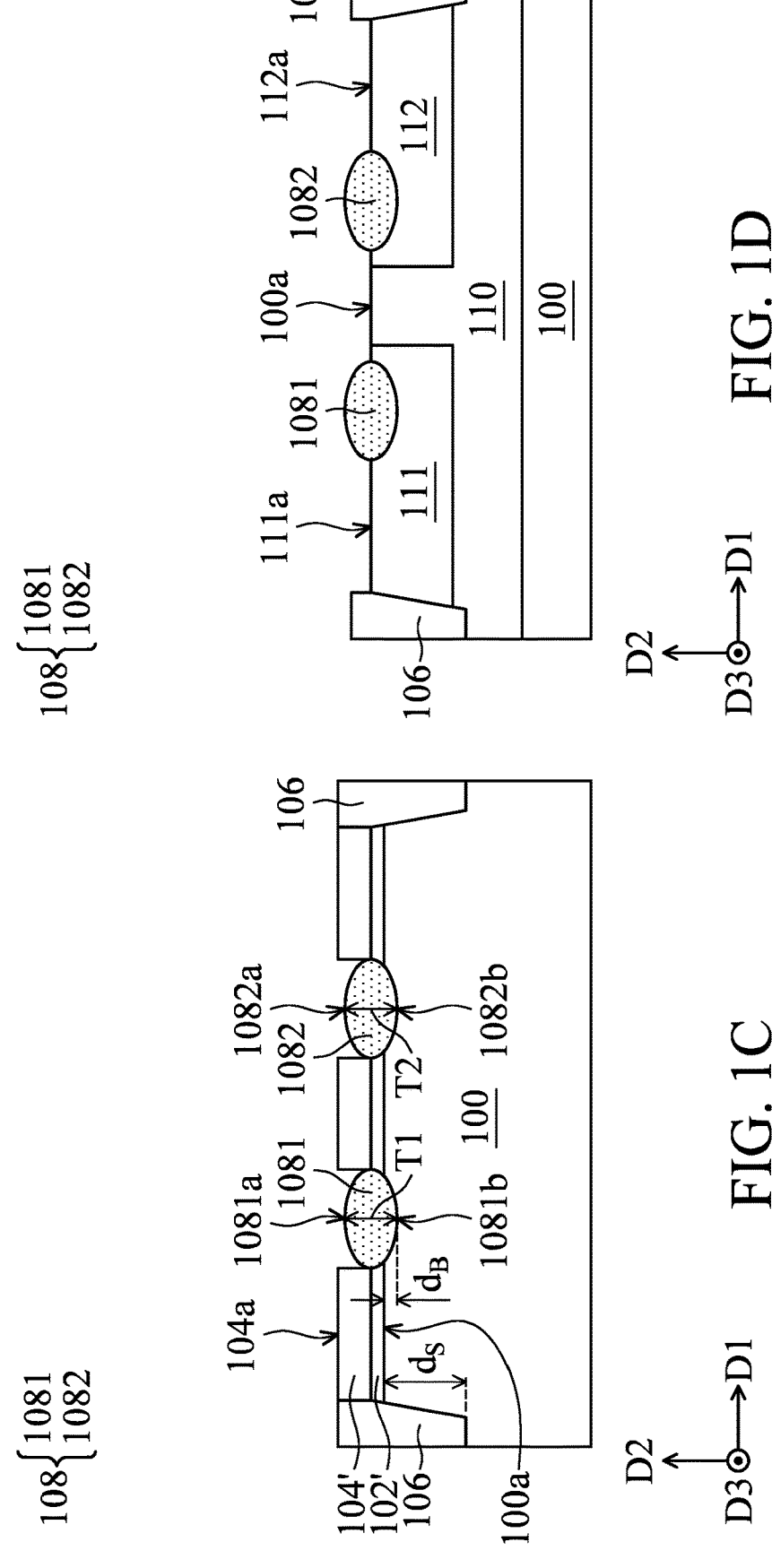

Next, referring to FIG. 1C, barrier portions 108 are formed in the holes 1040, in accordance with some embodiments of the present disclosure. The barrier portions 108 may be formed by a thermal oxidation process. In this exemplified embodiment, the barrier portions 108 can be formed by thermally oxidizing the material of the substrate 100 through the holes 1040 (such as the first hole 1041 and the second hole 1042) of the patterned hard mask layer 104'.

In this exemplified embodiment, as shown in FIG. 1C, a thermal oxidation process is performed, so as to form the first barrier portion 1081 in the first hole 1041 and the second barrier portion 1082 in the second hole 1042.

In addition, after the holes 1040 (such as the first hole 1041 and the second hole 1042) are formed, the portions of the pad oxide layer 102 that are exposed by the holes 1040 may be left or completely removed before the formation of the barrier portions 108. In some embodiments, the thickness of the pad oxide layer 102 is, for example, about 10 Å to 100 Å, and the material of the substrate 100 can still be thermally oxidized by a thermal oxidation process to form the barrier portions 108. In some embodiments, the portions of the pad oxide layer 102 that are exposed by the holes 1040 are removed to make the substrate 100 more susceptible to the thermal oxidation, so as to form the barrier portions 108.

In some embodiments, the thicknesses of the barrier portions 108 are measured from the bottommost portions of the barrier portions to the topmost portions of the barrier portions. For example, the first barrier portion 1081 has a thickness T1 in the second direction D2 from the topmost portion 1081a to the bottommost portion 1081b. The second barrier portion 1082 has a thickness T2 in the second direction D2 from the topmost portion 1082a to the bottommost portion 1082b. The second direction D2 is different from the first direction D1. In one example, the second direction D2 is perpendicular to (but not limited to) the first direction D1. The thickness T1 of the barrier portions 108 (such as the first barrier portion 1081 and the second barrier portion 1082) is in the range of about 500 Å to about 2000 Å, for example, 1000 Å to 1200 Å.

In addition, the barrier portions 108 (such as the first barrier portion 1081 and the second barrier portion 1082) extend in the third direction D3, in accordance with some embodiments of the present disclosure. The third direction D3 is different from the second direction D2 and different from the first direction D1. In one example, the third direction D3 is perpendicular (but not limited) to the second direction D2 and perpendicular (but not limited) to the first direction D1. In some embodiments, each of the barrier portions 108 has an arc-shaped top surface.

In addition, as shown in FIG. 1C, the depth $d_S$ of the isolation structures 106 in the substrate 100 along the second direction D2 is greater than the depth $d_B$ of the barrier portions in the substrate 100 along the second direction D2, in accordance with some embodiments of the present disclosure.

In addition, as shown in FIG. 1C, in some embodiments, the topmost portions of the barrier portions 108, such as the topmost portion 1081a of the first barrier portion 1081 and the topmost portion 1082*a* of the second barrier portion 1082, are below the top surface 104*a* of the patterned hard mask layer 104'.

After the barrier portions 108 (such as the first barrier portion 1081 and the second barrier portion 1082) are formed in the holes 1040, the patterned hard mask layer 104' is removed, in accordance with some embodiments of the present disclosure. Then, the subsequent processes, such as the related processes for manufacturing a MOS semiconductor structure, are performed.

Referring to FIG. 1D, in some embodiments, after the patterned hard mask layer 104' is removed, one or more well regions are formed in the substrate 100. For example, an ion implantation is performed to form the first well region 111 and the second well region 112 in the substrate 100. The first well region 111 and the second well region 112 have the second conductivity type. The second conductivity type is, for example, but not limited to, n-type. In the application of a high-voltage double-diffused metal-oxide-semiconductor (DDD MOS) structure, the well regions (such as the first well region 111 and the second well region 112) function as drift regions. In some exemplified embodiments, the substrate 100 is doped, and the dopants are implanted into the top portion of the substrate 100. In some embodiments, the dopant atoms are thermally activated to achieve driven-in diffusion of dopants.

In addition, the positions of the well regions are related to the positions of the barrier portions 108, in accordance with some embodiments of the present disclosure. For example, the first well region 111 and the second well region 112 correspond to the first barrier portion 1081 and the second barrier portion 1082, respectively. As shown in FIG. 1D, a portion of the first barrier portion 1081 is disposed in the first well region 111 of the substrate 100, and a portion of the second barrier portion 1082 is disposed in the second well region 112 of the substrate 100.

In some embodiments, a deep well 110 is further formed in the substrate 100. The conductivity type of the deep well 110 is the same as the conductivity type of the substrate 100. For example, an ion implantation is performed to form the deep well 110 that has the first conductivity type in the substrate 100. The first conductivity type is, for example, but not limited to, p-type. In addition, the well regions (such as the first well region 111 and the second well region 112) are formed in the deep well 110, as shown in FIG. 1D. In addition, in some embodiments, the doping concentration of the well regions (such as the first well region 111 and the second well region 112) is greater than the doping concentration of the deep well 110.

The ion implantation process would cause damage to the pad oxide layer 102. However, the gate dielectric layer of the semiconductor structure requires a dielectric layer with intact material without damage, so that the applied semiconductor structure has good electrical properties. According to some embodiments, after the well regions (such as the first well region 111 and the second well region 112) are formed, the pad oxide layer 102 can be removed, and the top surface 100*a* of the substrate 100 and the top surface of the well region are exposed. The aforementioned removal process includes, for example, a dry etching process, a wet etching process, or a combination thereof. As shown in FIG. 1D, in this exemplified embodiment, the pad oxide layer 102 can be removed by using a suitable etchant and a wet etching process to expose a portion of the top surface 100*a* of the substrate 100 that is between the first well region 111 and the second well region 112. Also, the top surface 111*a* of the first well region 111 and the top surface 112*a* of the second well region 112 are exposed after the pad oxide layer 102 is removed. In one example, the top surface 100*a* of the substrate 100 is level with the top surface 111*a* of the first well region 111 and the top surface 112*a* of the second well region 112.

In addition, the isolation structures 106 and the pad oxide layer 102 include silicon oxide, in accordance with some embodiments of the present disclosure.

Figures 1E, 1F:
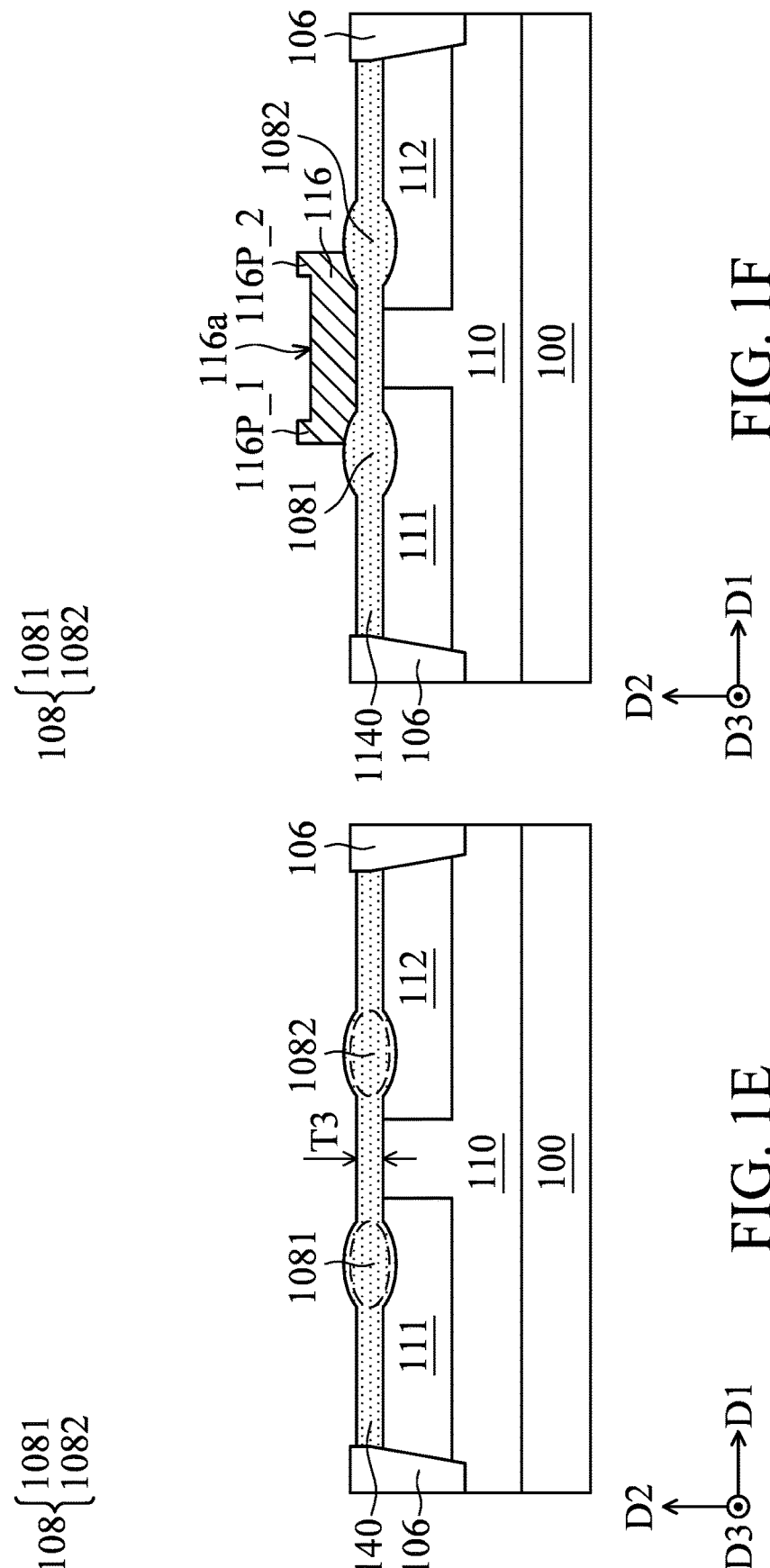

Referring to FIG. 1E, in some embodiments, a dielectric material layer 1140 is formed on the substrate 100 to improve the quality of a gate dielectric layer GD (FIG. 1G) that is formed in the subsequent process. The dielectric material layer 1140 includes, for example, silicon oxide, silicon oxynitride, silicon germanium oxide, germanium oxide, another suitable material, or a combination of the foregoing materials. The dielectric material layer 1140 and the barrier portions 108 (such as the first barrier portion 1081 and the second barrier portion 1082) may, but are not limited to, include the same dielectric material. In some embodiments, the dielectric material layer 1140 and the barrier portions 108 are formed by using a thermal oxidation process, a chemical oxidation process, an atomic layer deposition (ALD) process, a chemical vapor deposition (CVD) process, another suitable method, or a combination thereof.

In one example, a thermal oxidation process is performed on the structure to oxidize the top surface 100*a* of the substrate 100, the top surface 111*a* of the first well region 111 and the top surface 112*a* of the second well region 112 to form the dielectric material layer 1140. In this exemplified embodiment, the barrier portions 108 (such as the first barrier portion 1081 and the second barrier portion 1082) and the dielectric material layer 1140 include silicon oxide. The barrier portions 108 and the dielectric material layer 1140 can be formed by oxidizing the silicon materials of the substrate 100 and the well regions (for example, the first well region 111 and the second well region 112) using different thermal oxidation processes.

During the aforementioned thermal oxidation processes, the material of the barrier portions 108 (such as the first barrier portion 1081 and the second barrier portion 1082) bonds to the dielectric material layer 1140, in accordance with some embodiments of the present disclosure. Thus, compared to the barrier portions 108 (represented by the dotted lines) that are formed in the holes 1040 (such as the first hole 1041 and the second hole 1042) of the patterned hard mask layer 104', the volume of the barrier portions 108 will grow slightly after the thermal oxidation processes are performed. For the sake of simplicity and clarity of description, the same reference numeral is still used to denote the slightly-grown barrier portions 108 in the following figures.

In addition, in some embodiments, the dielectric material layer 1140 has a thickness T3 in the second direction D2. The thickness T3 is in the range of about 100 Å to about 650 Å. For a semiconductor structure that is operated in a high voltage (HV), the thickness T3 of the dielectric material layer 1140 is, for example, in the range of about 200 Å to about 650 Å. In some embodiments, the thickness T3 of the dielectric material layer 1140 is smaller than the thickness T1 of the first barrier portion 1081 and smaller than the thickness T2 of the second barrier portion 1082.

The above-mentioned values and ranges of the thickness are merely provided for illustrative purposes. The actual thickness of the dielectric material layer 1140 may be determined by an operation voltage of a semiconductor device in the application. Accordingly, the thickness of the dielectric material layer 1140 is not limited thereto.

Next, referring to FIG. 1F, a gate electrode 116 is formed on the dielectric material layer 1140, and a portion of the gate electrode 116 extends to the barrier portions 108 (such as the first barrier portion 1081 and the second barrier portion 1082), in accordance with some embodiments of the present disclosure.

The gate electrode 116 can be formed by a deposition process and a patterning process. For example, an electrode material layer can be deposited over the structure shown in FIG. 1E, and then patterned using a suitable lithography process (such as a photolithography process) and an etching process to form the gate electrode 116. The electrode material layer includes, for example, polysilicon, another suitable conductive material, or a combination thereof. The lithography process includes, for example, photoresist (not shown) coating (for example, spin-coating), soft baking, mask alignment, exposure, post-exposure baking, photoresist development, cleaning and drying (for example, hard baking), another suitable process, or a combination thereof. The etching process includes, for example, a dry etching process or a wet etching process. The aforementioned electrode material layer is a polysilicon (poly-Si) layer, and the polysilicon layer is patterned by using a photolithography process and an isotropic etching process, so as to form the gate electrode 116, in accordance with some embodiments of the present disclosure.

In addition, in this exemplified embodiment, as shown in FIG. 1F, since the first barrier portion 1081 and the second barrier portion 1082 are positioned below the gate electrode 116, two ends of the gate electrode 116 extend to overlie a part of the first barrier portion 1081 and a part of the second barrier portion 1082, respectively. In some embodiments, the opposite sides of the gate electrode 116 do not extend beyond the outermost edges of the first barrier portion 1081 and the second barrier portion 1082, respectively.

In addition, in this exemplified embodiment, since both ends of the gate electrode 116 are respectively disposed on the first barrier portion 1081 and the second barrier portion 1082, the gate electrode 116 has protruding portions that correspond to the barrier portions. For example, the protruding portion 116P_1 of the gate electrode 116 corresponds to the first barrier portion 1081, and the protruding portion 116P_2 of the gate electrode 116 corresponds to the second barrier portion 1082. Accordingly, a middle portion of the top surface 116a of the gate electrode 116 is lower than the two end portions of the top surface 116a of the gate electrode 116.

Figures 1G, 1H:
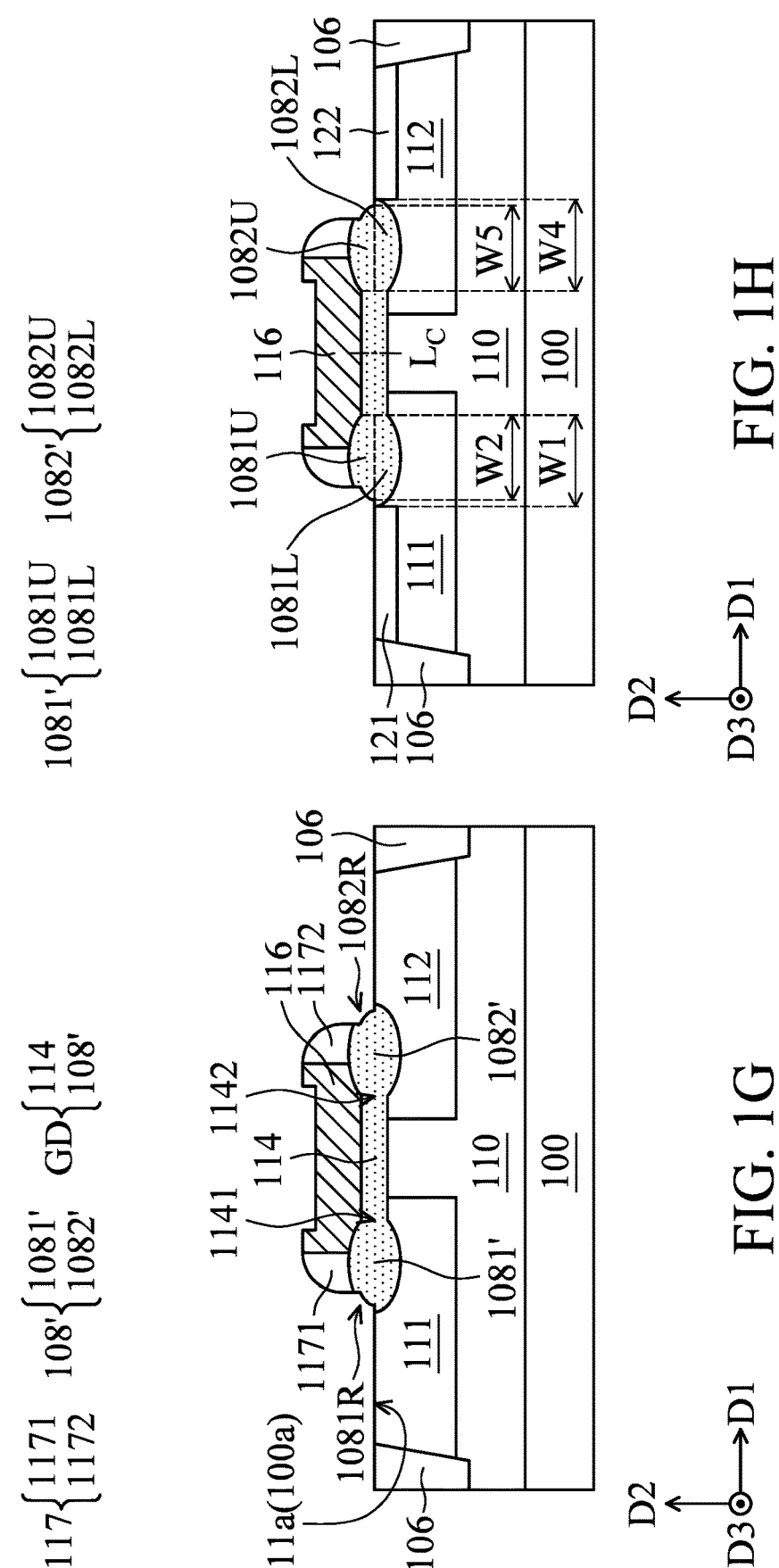

Next, referring to FIG. 1G, the gate spacers 117 are formed on opposite sides of the gate electrode 116, and a gate dielectric layer GD is formed between the substrate 100 and the gate electrode 116, in accordance with some embodiments of the present disclosure. In this exemplified embodiment, the gate spacers 117 are formed on the barrier portions 108' (including the first barrier portion 1081' and the second barrier portion 1082'), such as overlying the top surfaces of the barrier portions 108'.

In this exemplified embodiment, the gate spacers 117 include a first gate spacer 1171 and a second gate spacer 1172 on the first barrier portion 1081' and the second barrier portion 1082', respectively. In some embodiments, the bottom surface of the first gate spacer 1171 is in direct contact with the top surface of the first barrier portion 1081', but is not in direct contact with the first well region 111. The bottom surface of the second gate spacer 1172 is in direct contact with the top surface of the second barrier portion 1082', but is not in direct contact with the second well region 112.

In some embodiments, formation of the gate spacers 117 includes the following steps. First, a spacer material (not shown) is conformally deposited on the dielectric material layer 1140 and covers the gate electrode 116. In some embodiments, the spacer material includes silicon oxide, silicon nitride, silicon nitride carbide (SiCN), silicon oxycarbide (SiOC), silicon oxynitride (SiOCN), another suitable insulating material, or a combination of the foregoing materials. In some embodiments, the spacer material includes multiple layers (not shown) such that those layers include different materials. Then, a portion of the spacer material and a portion of the dielectric material layer 1140 are removed by using a suitable lithography process (such as a photolithography process) and an etching process. The aforementioned lithography process includes, for example, photoresist (not shown) coating (for example, spin-coating), soft baking, mask alignment, exposure, post-exposure baking, photoresist development, cleaning and drying (for example, hard baking), another suitable process, or a combination thereof. The aforementioned etching process includes, for example, a dry etching process, a wet etching process, or a combination thereof. After the portion of the spacer material and the portion of the dielectric material layer 1140 are removed, the remaining portion of the spacer material forms the gate spacers 117, and the remaining portion of the dielectric material layer 1140 forms a dielectric body portion (also can be referred to as a base portion) 114, in accordance with some embodiments of the present disclosure.

In addition, the barrier portions 108 (FIG. 1F) may also be partially removed during the removal of the portion of the spacer material and the portion of the dielectric material layer 1140, in accordance with some embodiments of the present disclosure. The barrier portions 108' (including the first barrier portion 1081' and the second barrier portion 1082') with recessed corners are formed (FIG. 1G). The positions of the recessed corners are, for example, on the sides of the barrier portions away from the gate electrode 116 and above the top surface 100a of the substrate 100.

Specifically, as shown in FIG. 1G, in some embodiments, the first barrier portion 1081' has a first recessed corner 1081R, which is located at one side of the first barrier portion 1081' and away from the base portion 114. The first recessed corner 1081R is located above the top surface 100a of the substrate 100. In this exemplified embodiment, the first barrier portion 1081' can be divided into an upper portion and a lower portion in a cross-sectional view (for example, the cross-sectional view in FIG. 1G), if the top surface 100a of the substrate 100 is referred to as a reference level. The first recessed corner 1081R is located at a corner of the upper portion of the first barrier portion 1081'.

Similarly, as shown in FIG. 1G, in some embodiments, the second barrier portion 1082' has a second recessed corner 1082R, which is located at one side of the second barrier portion 1082' and away from the base portion 114, and the second cutout 1082R is located above the top surface 100a of the substrate 100. In this exemplified embodiment, the second barrier portion 1082' can also be divided into an upper portion and a lower portion in a cross-sectional view (for example, the cross-sectional view in FIG. 1G), if the top surface 100a of the substrate 100 is referred to as a reference level. The second recessed corner 1082R is located at a corner of the upper portion of the second barrier portion 1082'.

In addition, as shown in FIG. 1G, the gate spacers 117 are located on the barrier portions 108 that have recessed corners, and the recessed corners of the barrier portions 108 are not covered by the gate spacers 117, in accordance with some embodiments of the present disclosure. Specifically, in one example, the first recessed corner 1081R of the first barrier portion 1081' is exposed outside the first gate spacer 1171 and is not covered by the first gate spacer 1171. The second recessed corner 1082R of the second barrier portion 1082' is exposed outside the second gate spacer 1172 and is not covered by the second gate spacer 1172.

In addition, a high electrical field intensity would be induced at a portion of the substrate that is adjacent to the edge of a gate electrode (such as the gate electrode 116), during operation of a typical semiconductor structure, especially during high voltage (HV) operation. In this exemplified embodiment, the gate dielectric layer GD as shown in FIG. 1G has two protruding end portions, such as the barrier portions 108' (including the first barrier portion 1081' and the second barrier portion 1082'), which can reduce the induced electric field intensity and improve the breakdown voltage. Therefore, the semiconductor structure of the embodiments can be operated at a high voltage and has good electrical performance.

Next, referring to FIG. 1H, a first doping region 121 and a second doping region 122 are formed in the well region, in accordance with some embodiments of the present disclosure. The top surfaces of the first doping region 121 and the second doping region 122 are exposed at the top surface of the well region. The first doping region 121 and the second doping region 122 serve as a source region and a drain region of the semiconductor structure, respectively.

In this exemplified embodiment, as shown in FIG. 1H, one end of the first doping region 121 that is adjacent to the gate electrode 116 is, for example, in contact with the outermost edge of the first barrier portion 1081'. In addition, the first doping region 121 extends along the top surface of the substrate 100, and the other end of the first doping region 121 extends to the adjacent isolation structure 106 in the first direction D1. Similarly, one end of the second doping region 122 that is adjacent to the gate electrode 116 is, for example, in contact with the outermost edge of the second barrier portion 1082'. In addition, the second doping region 122 extends along the top surface of the substrate 100, and the other end of the second doping region 122 extends to the adjacent isolation structure 106 in the first direction D1.

In some embodiments, the first doping region 121 is formed in the first well region 111, and the second doping region 122 is formed in the second well region 112. In addition, the first doping region 121 and the second doping region 122 have the same conductivity type, for example, the first conductivity type. The second conductivity type is, for example, but not limited to, n-type. In addition, in some embodiments, the doping concentration of the first doping region 121 is greater than the doping concentration of the first well region 111, and is greater than the doping concentration of the deep well 110. The doping concentration of the second doping region 122 is greater than the doping concentration of the second well region 112, and is greater than the doping concentration of the deep well 110.

Next, the subsequent manufacturing processes for forming a semiconductor structure, including formation of an interlayer dielectric layer (ILD)(not shown), formation of contact holes (not shown) that correspond to gate electrodes, source regions and drain regions in the interlayer dielectric layer, and formation of gate electrode contacts, source contacts and drain contacts (not shown) in these contact holes are performed. Thus, the fabrication of a semiconductor structure (such as a high voltage semiconductor structure) is completed.

Figure 2:
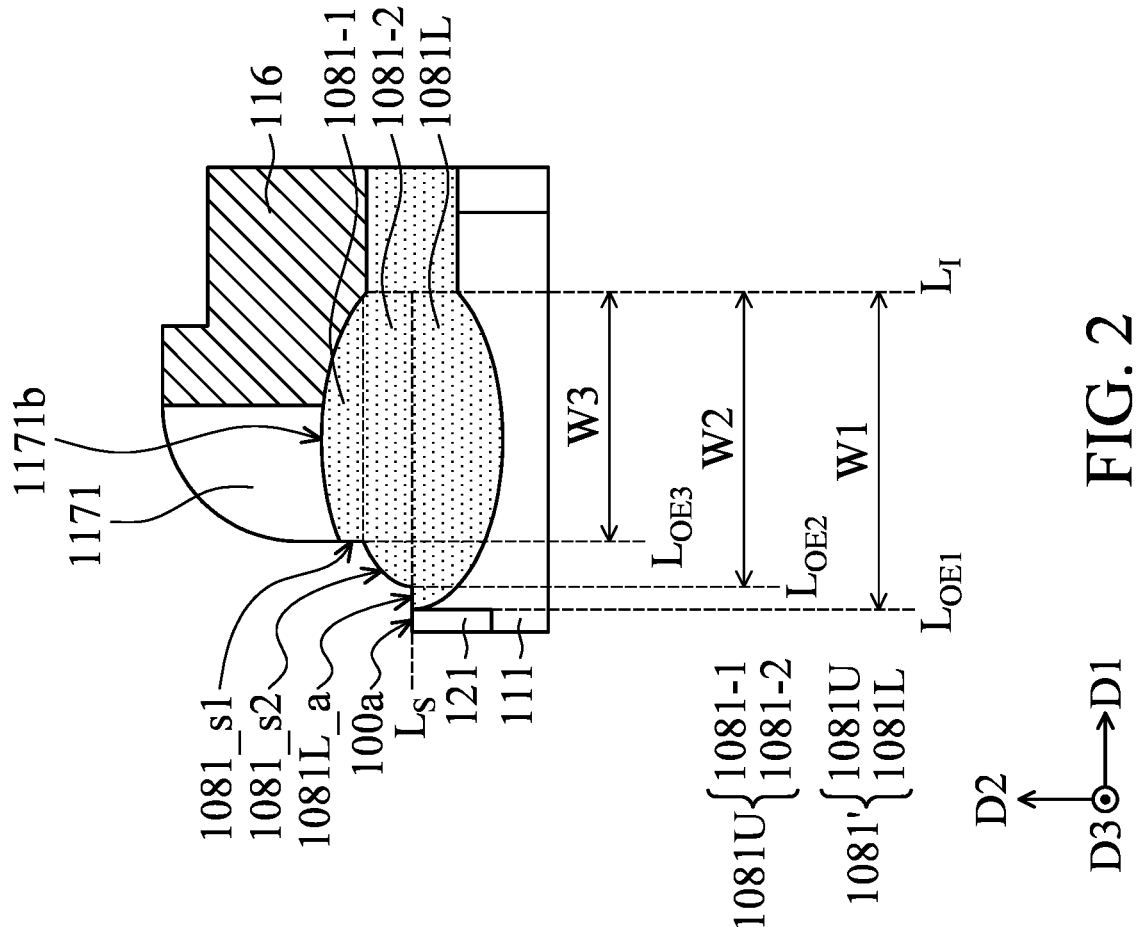
FIG. 2 is an enlarged partial cross-sectional view of the semiconductor structure of FIG. 1H, which shows the first barrier portion and the first gate spacer on the first barrier portion.

Please refer to the FIG. 1H and FIG. 2. FIG. 2 is an enlarged partial cross-sectional view of the semiconductor structure of FIG. 1H. FIG. 2 shows an enlarged view of the first barrier portion 1081' and the first gate spacer 1171 on the first barrier portion 1081'. The second barrier portion 1082' and the second gate spacer 1172 on the second barrier portion 1082' can be referred to FIG. 2.

In some embodiments, as shown in the first barrier portion 1081' that has the recessed corner 1081R of the semiconductor structures of FIG. 1H and FIG. 2, the first barrier portion 1081' can be divided into an upper portion 1081U and a lower portion 1081L when the top surface 100a of the substrate 100 is referred to as a reference level (which can be represented by the horizontal line $L_S$ in FIG. 2). The upper portion 1081U is located above the top surface 100a of the substrate 100. The first recessed corner 1081R is located at a corner of the upper portion 1081U of the first barrier portion 1081'. The lower portion 1081L of the first barrier portion 1081' is buried in the substrate 100.

In some embodiments, a maximum width W1 of the lower portion 1081L of the first barrier portion 1081' can be defined as a distance in the first direction D1 between an interface between the lower portion 1081L and the base portion 114 (as represented by line $L_1$ in FIG. 2) and the outermost edge (as represented by line $L_{OE1}$ in FIG. 2) of the lower portion 1081L. A maximum width W2 of the upper portion 1081U of the first barrier portion 1081' can be defined as a distance in the first direction D1 between an interface between the upper portion 1081U and the base portion 114 (as represented by line $L_1$ in FIG. 2) and the outermost edge (as represented by line $L_{OE2}$ in FIG. 2) of the upper portion 1081U. The maximum width W1 of the lower portion 1081L is greater than the maximum width W2 of the upper portion 1081U.

In some embodiments, the outermost edge (as represented by line $L_{OE1}$ in FIG. 2) of the lower portion 1081L of the first barrier portion 1081' protrudes beyond the outermost edge (as represented by line $L_{OE2}$ in FIG. 2) of the upper portion 1081U of the first barrier portion 1081'.

In some embodiments, the area of the top surface 1081L_a of the lower portion 1081L of the first barrier portion 1081' is greater than the area of the bottom surface (i.e. the area related to the maximum width W2) of the upper portion 1081U of the first barrier portion 1081'.

According to the aforementioned descriptions, when the portion of the spacer material and the portion of the dielectric material layer 1140 are removed, parts of the first barrier portion 1081' and the second barrier portion 1082' are removed simultaneously to form the recessed corners, in accordance with some embodiments of the present disclosure. The parts of the barrier portions that are farther from the gate spacers have less removing amounts of material, since the barrier portions 108' (such as the first barrier portion 1081' and the second barrier portion 1082') are thicker than the dielectric material layer 1140. For example, the part of the barrier portion that is in directly contact with the gate spacer has the largest removing amount of material. The part of the barrier portion that is adjacent to the substrate 100 has less removing amount of material. In some embodiments, after the removal process is completed, the parts of the barrier portion that are adjacent to the substrate 100 have a gradient change amount of material.

Specifically, in the semiconductor structure of FIG. 1H and FIG. 2, the bottom surface 1171b of the first gate spacer 1171 is in direct contact with the first portion 1081-1 of the first barrier portion 1081', and the sidewall 1081_s1 of the first portion 1081-1 is aligned with the outermost edge of the bottom surface 1171b of the first gate spacer 1171, in accordance with some embodiments. The second portion 1081-2 is closer to the substrate 100 than the first portion 1081-1, and the sidewall 1081_s2 protrudes beyond the sidewall 1081_s1 of the first portion 1081-1. In some embodiments, the sidewall 1081_s2 of the second portion 1081-2 is a curved sidewall, as shown in FIG. 2. In addition, in some embodiments, the first portion 1081-1 is located between the first gate spacer 1171 and the second portion 1081-2. The first gate spacer 1171 does not cover the second portion 1081-2 of the first barrier portion 1081'. In FIG. 2, a part of the second portion 1081-2 protrudes beyond the first gate spacer 1171.

In addition, each of the barrier portions 108 has a stepped portion that corresponds to the recessed corner, in accordance with some embodiments of the present disclosure. For example, the surface of each of the barrier portions 108 has a stepped cross-sectional profile. Specifically, as shown in the cross-sectional views of FIG. 1H and FIG. 2, the sidewall 1081_s1 of the first portion 1081-1, the sidewall 1081_s2 of the second portion 1081-2 and a portion of the top surface of the lower portion 1081L of the first barrier portion 1081' collectively form a stepped cross-sectional profile.

In addition, in some embodiments, the first portion 1081-1 of the first barrier portion 1081' has a first bottom width W3 in the first direction D1. The first bottom width W3 can be defined as a distance between the interface between the upper portion 1081U and the base portion 114 (as represented by line $L_1$ in FIG. 2) and the outermost edge of the first portion 1081-1 (as represented by line $L_{OE3}$ in FIG. 2 or the sidewall 1081_s1) in the first direction D1. The second portion 1081-2 has a second bottom width in the first direction D1 (that is, the above-mentioned maximum width W2), and the lower portion 1081L has a top-surface width in the first direction D1 (that is, the above-mentioned maximum width W1), in accordance with some embodiments. The first bottom width W3 is less than the second bottom width (i.e. W2), and the second bottom width (i.e. W2) is less than the top-surface width (i.e. W1).

According to some embodiments of the present application, the semiconductor structure in FIG. 1H is a symmetrical MOS structure. The first barrier portion 1081' and second barrier portion 1082' are formed to have similar configurations. Specifically, the first barrier portion 1081' that has the first recessed corner 1081R and the second barrier portion 1082' that has the second recessed corner 1082R are substantially mirror-symmetrical with respect to a center line $L_C$ of the gate dielectric layer GD, as shown in FIG. 1H.

In addition to the above-mentioned manufacturing methods as provided in FIG. 1A-FIG. 1H to form a symmetric semiconductor structure, the semiconductor structures of some other embodiments can be fabricated by another manufacturing method. FIG. 3A-FIG. 3H illustrate cross-sectional views of intermediate stages of a method for manufacturing a semiconductor structure in accordance with some embodiments of the present disclosure. The features/components in FIG. 3A-FIG. 3H similar or identical to the features/components in FIG. 1A-FIG. 1H are designated with similar or the same reference numbers, and the details of those similar or the identical features/components can be referred to the related contents in the aforementioned descriptions.

Figures 3A, 3B:
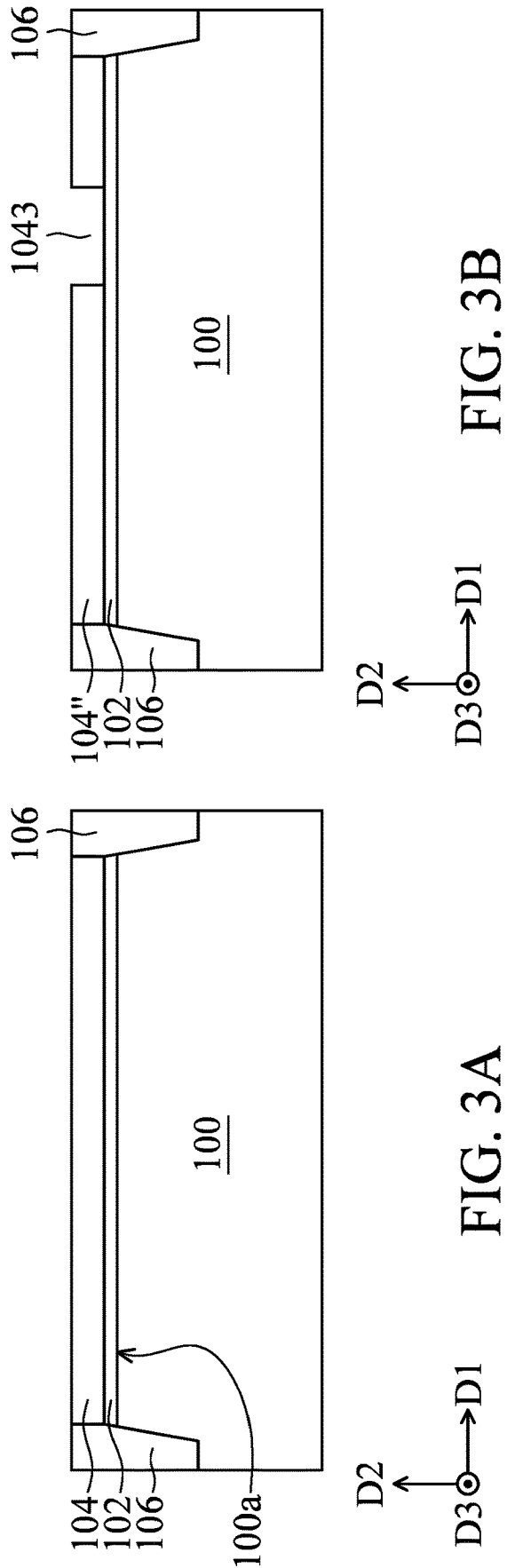
FIG. 3A, FIG. 3B, FIG. 3C, FIG. 3D, FIG. 3E, FIG. 3F, FIG. 3G and FIG. 3H illustrate cross-sectional views of intermediate stages of a method for manufacturing a semiconductor structure in accordance with some embodiments of the present disclosure.

Referring to FIG. 3A, a substrate 100 that has a first conductivity type is provided. A pad oxide layer 102, a patterned hard mask layer 104 and an isolation structure 106 are formed on the substrate 100, in accordance with some embodiments of the present disclosure. Details of the arrangement, materials and manufacturing methods of the components shown in FIG. 3A are essentially the same as what have been discussed referring to FIG. 1A. Those details are not repeated herein for the purpose of simplicity and clarity.

Next, referring to FIG. 3B, a patterning step is performed on the patterned hard mask layer 104 again, so as to form the patterned hard mask layer 104", in accordance with some embodiments of the present disclosure. The patterned hard mask layer 104", for example, has a second pattern. The second pattern is different from the first pattern that is used to form the isolation structures 106. In some embodiments, the patterned hard mask layer 104 is etched, so that the patterned hard mask layer 104" has holes 1043 to expose the underlying pad oxide layer 102. Details of the arrangement, materials and manufacturing methods of the components shown in FIG. 3B are essentially the same as what have been discussed referring to FIG. 1B. Those details are not repeated herein for the purpose of simplicity and clarity.

Figures 3C, 3D:
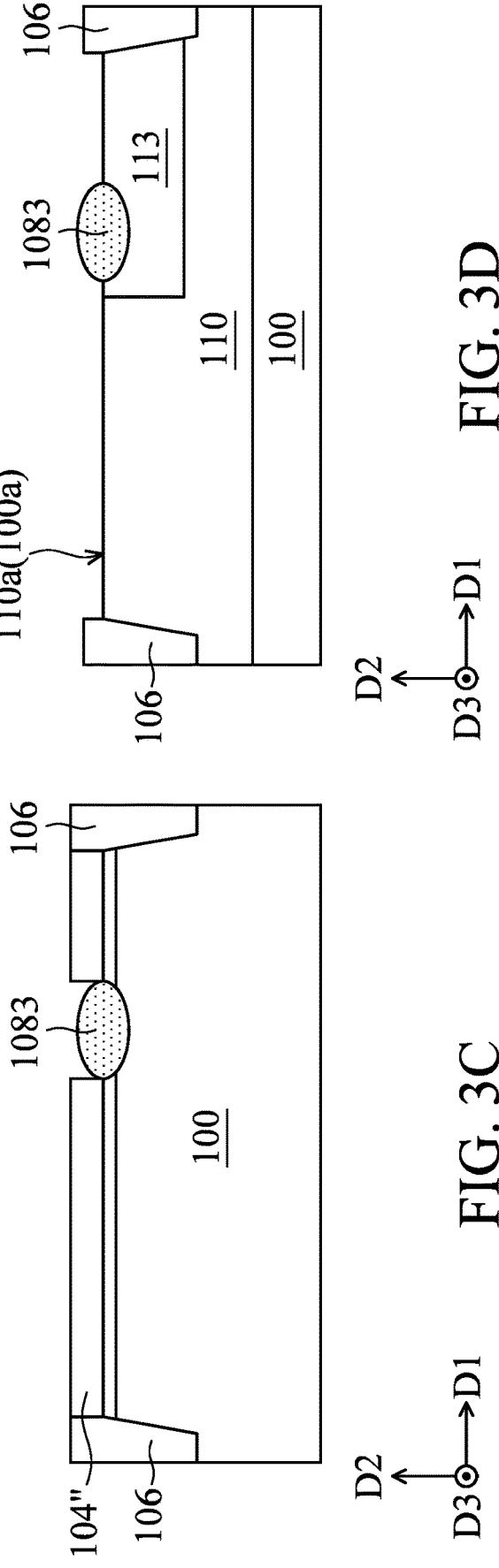

Next, referring to FIG. 3C, a barrier portion 1083 is formed in the hole 1043, in accordance with some embodiments of the present disclosure. In addition, after the hole 1043 is formed, the portion of the pad oxide layer 102 that is exposed by the hole 1043 may be left or completely removed before forming the barrier portion 1083. Details of the method for manufacturing the barrier portion 1083 can be referred to the above-mentioned related contents in FIG. 1C, and are not repeated herein.

After the barrier portion 1083 is formed in the hole 1043, the patterned hard mask layer 104" is removed.

Referring to FIG. 3D, after the patterned hard mask layer 104" is removed, a deep well 110 and a well region 113 are formed in the substrate 100, in accordance with some embodiments of the present disclosure. The conductivity type of the well region 113 is different from the conductivity type of the substrate 100, and the conductivity type of the deep well 110 is the same as the conductivity type of the substrate 100. For example, the substrate 100 and the deep well 110 are p-type, and the well region 113 is n-type. In some embodiments, the well region 113 corresponds to the barrier portion 1083. For example, the lower portion of the barrier portion 1083 is disposed in the well region 113. Details of the arrangement, materials and manufacturing methods of the components shown in FIG. 3D are essentially the same as what have been discussed referring to FIG. 1D, and are not repeated herein.

Figures 3E, 3F:
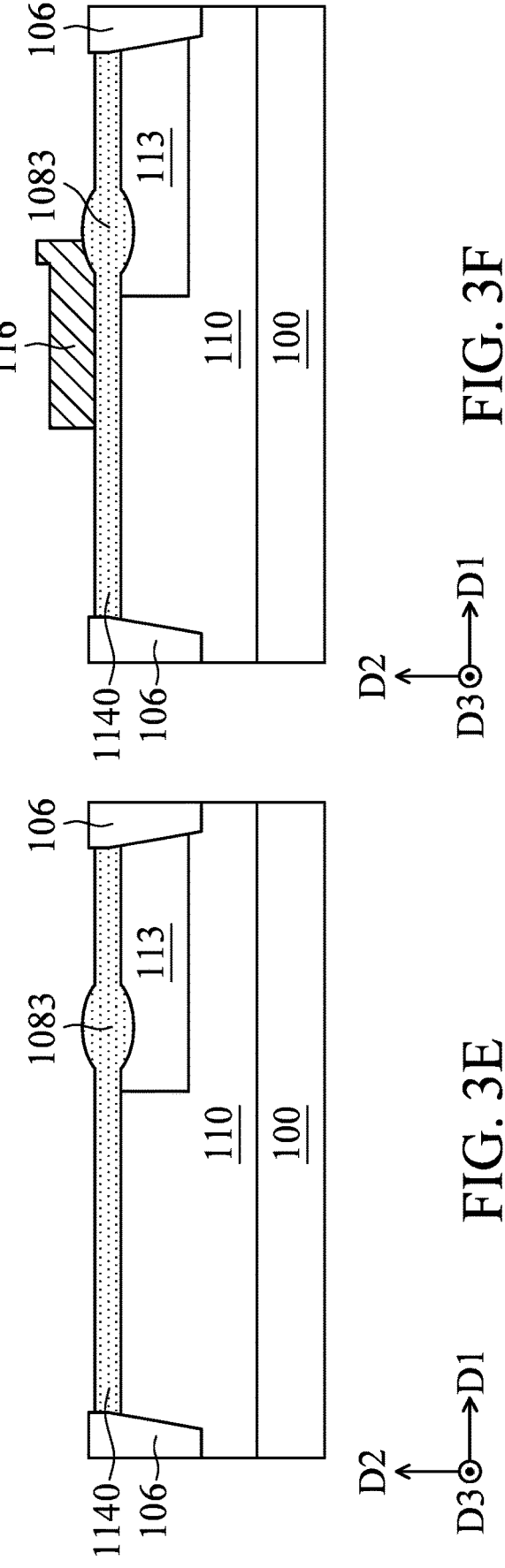

Next, referring to FIG. 3E, a dielectric material layer 1140 is formed on the substrate 100, in accordance with some embodiments of the present disclosure. Details of the material and the manufacturing method of the dielectric material layer 1140 and the arrangement of the other components shown in FIG. 3E are essentially the same as what have been discussed referring to FIG. 1E. Those details are not repeated herein for the purpose of simplicity and clarity.

Next, referring to FIG. 3F, a gate electrode 116 is formed on the dielectric material layer 1140, and a portion of the gate electrode 116 extends to the barrier portion 1083, in accordance with some embodiments of the present disclosure. Details of the material and the manufacturing method of the gate electrode 116 and the relative arrangement of the other components (such as the barrier portion 1083) and the gate electrode 116 shown in FIG. 3F can be referred to the above-mentioned related contents (such as the barrier portion 1082 and the gate electrode 116) in FIG. 1F. Those details are not repeated herein for the purpose of simplicity and clarity.

Figures 3G, 3H:
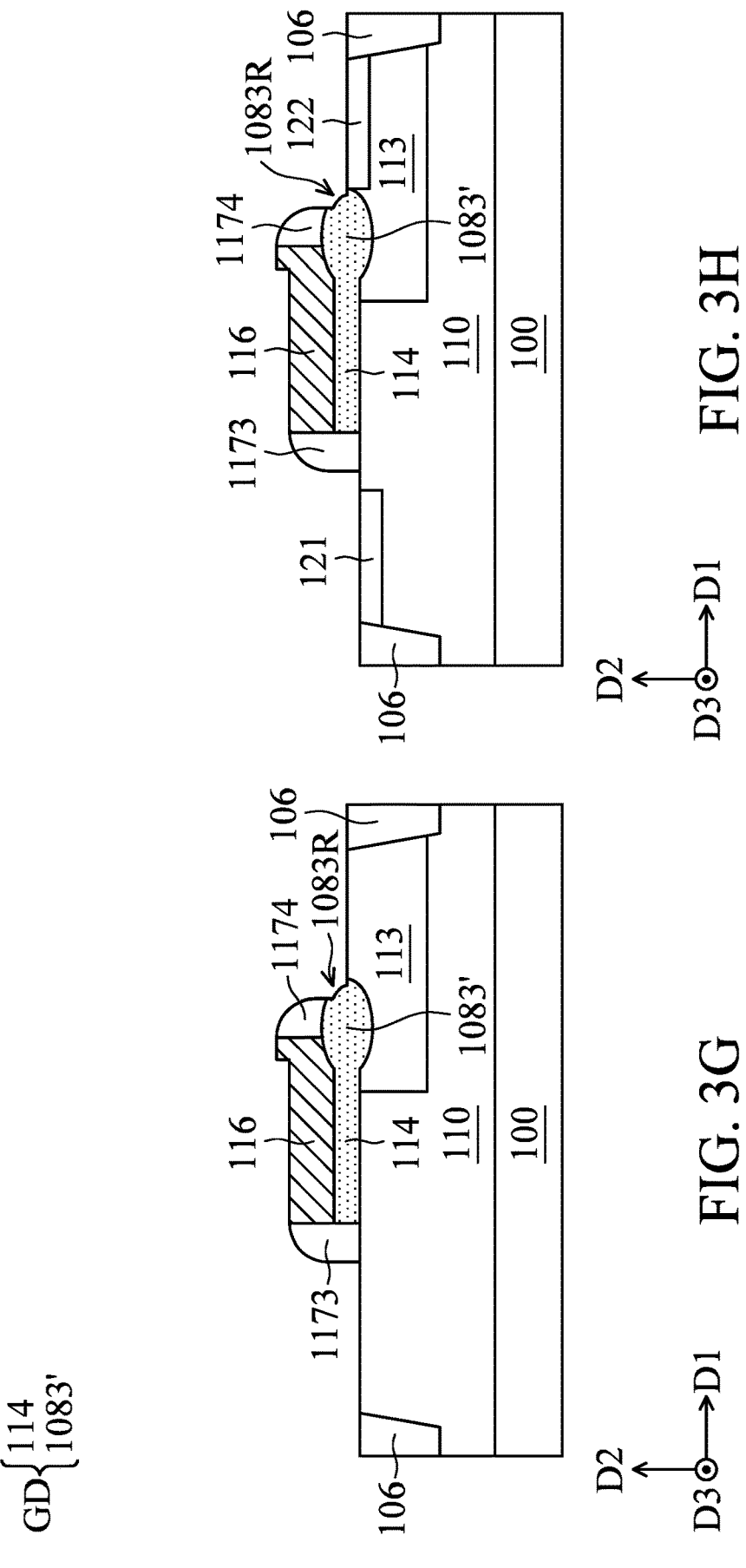

Next, referring to FIG. 3G, the gate spacers (gate spacers) 1173 and 1174 are formed on opposite sides of the gate electrode 116, and a gate dielectric layer GD is formed between the substrate 100 and the gate electrode 116, in accordance with some embodiments of the present disclosure. The gate spacer 1174 is formed on the barrier portion 1083', and the barrier portion 1083' has a recessed corner 1083R. In this exemplified embodiment, the base portion 114 and the barrier portion 1083' that connects one end of the base portion 114 collectively form a gate dielectric layer GD. In addition, details of the arrangement, materials and manufacturing methods of the components shown in FIG. 3G are essentially the same as what have been discussed referring to FIG. 1G, and are not repeated herein.

Next, referring to FIG. 3H, in some embodiments, a first doped region 121 and a second doped region 122 are formed to serve as a source region and a drain region of the semiconductor structure, respectively. The second doped region 122 is formed in the well region 113. In this exemplified embodiment, the barrier portion 1083' is adjacent to the drain region (e.g. the second doped region 122). During operation of the semiconductor structure, especially during high voltage operation, the electric field intensity can be reduced by the barrier portion 1083', thereby improving the breakdown voltage of the semiconductor structure. Thus, the semiconductor structure of the embodiments that is operated at a high voltage has improved electrical performance. Details of the arrangement, materials and manufacturing methods of the components shown in FIG. 3H are essentially the same as what have been discussed referring to FIG. 1H. Those details are not repeated herein for the purpose of simplicity and clarity.

Figure 4:
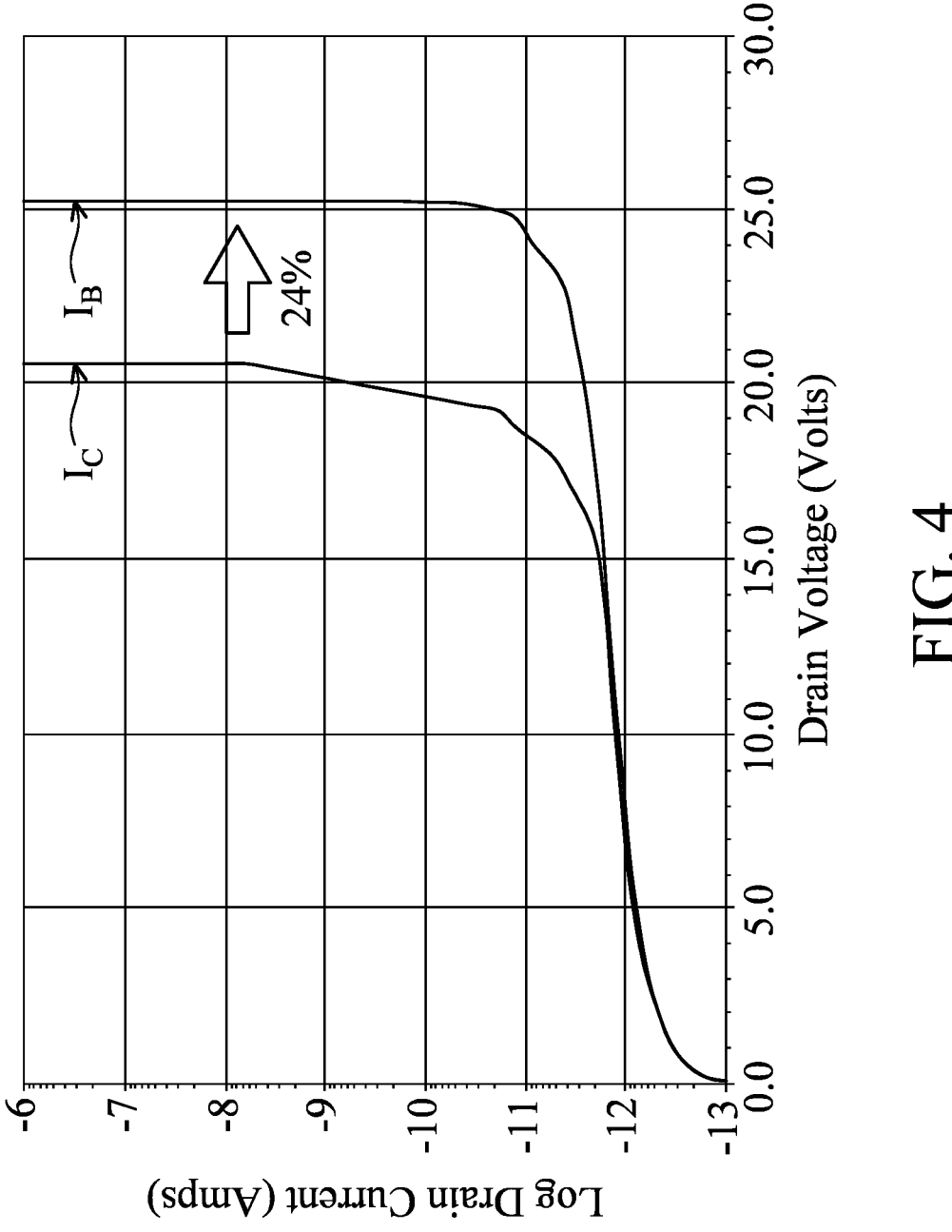
FIG. 4 shows current-voltage (I-V) curves that are plotted from results of electrical simulations of N-type semiconductor structures (such as NMOS devices) using semiconductor technologies and technology computer aided design (TCAD).

FIG. 4 shows current-voltage (I-V) curves that are plotted from results of electrical simulations of N-type semiconductor structures (such as NMOS devices) using semiconductor technologies and technology computer aided design (TCAD). The curve $I_C$ is a current-voltage (I-V) curve that is obtained by measuring the drain and the substrate of a conventional N-type semiconductor structure (i.e., the gate dielectric layer GD has no barrier portion). The curve $I_B$ is a current-voltage (I-V) curve that is obtained by measuring the drain and the substrate of an N-type semiconductor structure of an embodiment (i.e., the gate dielectric layer GD has the barrier portion). The curves in FIG. 4 are plotted with a logarithmic scale of drain current on the y-axis. According to the simulation results in FIG. 4, the electric field intensity that is generated at the edge of the substrate adjacent to the drain is significantly reduced by the barrier portion(s) of the N-type semiconductor structure of the embodiment. In addition, the breakdown voltage of the N-type semiconductor structure of the embodiment effectively improves by about 24%. Accordingly, the electrical performance of the semiconductor structure of the embodiment is effectively improved. In addition, electrical simulations for a conventional P-type semiconductor structure (such as a PMOS device) and a P-type semiconductor structure (with barrier portions) of the embodiment are performed by semiconductor technologies and technology computer aided design (TCAD). According to the simulation results (not shown), the electric field intensity that is generated at the edge of the substrate adjacent to the drain is significantly reduced by the barrier portion(s) of the P-type semiconductor structure of the embodiment. The breakdown voltage of the P-type semiconductor structure of the embodiment effectively improves by about 30%.

According to some embodiments of the present disclosure, a patterned hard mask layer is provided for the fabrications of the isolation structure and the barrier portion(s) of the gate dielectric layer. Therefore, no additional process is required to form the barrier portion(s) of the embodiment. In addition, the barrier portions of the embodiment are formed before forming the deep well, the well regions (such as the first well region 111 and the second well region 112 in FIG. 1D, and the well region 113 in FIG. 3D) and the doped regions. Accordingly, the formation of the barrier portion does not affect the subsequent fabrication of the semiconductor structure. Therefore, the manufacturing method of the embodiments of the present disclosure as provided herein will not adversely change the diffusion range of the formed deep wells, well regions and doped regions (for example, the diffusion regions diffuse outwardly and have unclear boundaries). Accordingly, the manufacturing methods of the embodiments have no deteriorating effect on the electric properties of the device. In addition, the manufacturing methods of the semiconductor structures provided in the embodiments are compatible with the current manufacturing processes, and the manufacturing methods of the embodiments are simple. Thus, the production cost for manufacturing the semiconductor structures of the embodiments does not increase.

In addition, according to the semiconductor structures fabricated by the manufacturing methods of some embodiments, the barrier portion is positioned under the gate spacer. During operation of the semiconductor structure, the electric field intensity adjacent to the edge of the gate electrode can be reduced by the barrier portion that has a recessed corner, thereby effectively improving the breakdown voltage of the semiconductor structure. The manufacturing method and the fabricated semiconductor structure of the embodiments are suitable in the application of high-voltage MOS devices, and the electrical performance of the high-voltage device can be effectively improved. In addition, the deep well, the well region and the doped regions of the semiconductor structure, in accordance with some embodiments, have stable diffusion regions without re-diffusion and unclear boundaries. Thus, the semiconductor structures of the embodiments have good electrical performance.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A semiconductor structure, comprising:
a substrate having a first conductivity type;
a well region in the substrate and having a second conductivity type;
a gate dielectric layer over the substrate and comprising:
a body portion extending on the substrate and having a first thickness; and

17 a barrier portion adjoining one end of the body portion and having a second thickness, wherein the second thickness is greater than the first thickness, and the barrier portion has a recessed corner; and a gate electrode on the gate dielectric layer, wherein the barrier portion comprises an upper portion formed over the substrate and a lower portion formed in the substrate, the recessed corner is positioned in a corner of the upper portion, and at least a portion of a surface of the lower portion is exposed by the recessed corner.

2. The semiconductor structure as claimed in claim 1, wherein the recessed corner of the barrier portion is away from the body portion, and the recessed corner is positioned above a top surface of the substrate.

3. The semiconductor structure as claimed in claim 1, further comprising an isolation structure in the substrate, wherein the isolation structure is arranged to surround the well region, the gate dielectric layer and the gate electrode.

4. The semiconductor structure as claimed in claim 3, wherein a depth of the isolation structure in the substrate is greater than a depth of the barrier portion in the substrate.

5. The semiconductor structure as claimed in claim 1, wherein a portion of the gate electrode extends to overlie a part of the barrier portion.

6. The semiconductor structure as claimed in claim 1, further comprising gate spacers on opposite sidewalls of the gate electrode, wherein one of the gate spacers is formed on the barrier portion and adjacent to the recessed corner of the barrier portion.

7. The semiconductor structure as claimed in claim 1, wherein a top surface of the lower portion is larger than a bottom surface of the upper portion.

8. The semiconductor structure as claimed in claim 1, further comprising:

a gate spacer at one side of the gate electrode, and a bottom surface of the gate spacer in direct contact with a first part of the upper portion of the barrier portion;

wherein a sidewall of the first part is aligned with an outermost side of the bottom surface of the gate spacer.

9. The semiconductor structure as claimed in claim 1, wherein the well region is a first well region, the barrier portion is a first barrier portion in the first well region, the semiconductor structure further comprises a second well region in the substrate and spaced apart from the first well region, wherein the second well region has the second conductivity type;

wherein the gate dielectric layer further comprises a second barrier portion in the second well region, and the first barrier portion and the second barrier portion connect two ends of the body portion respectively.

10. A method for manufacturing the semiconductor structure as claimed in claim 1, comprising:

providing the substrate having the first conductivity type;

forming a patterned hard mask layer over the substrate;

etching the patterned hard mask layer to form a hole that penetrates at least the patterned hard mask layer;

forming the barrier portion in the hole;

removing the patterned hard mask layer;

forming the well region in the substrate, wherein the well region has the second conductivity type and is disposed corresponding to the barrier portion; and forming a gate structure over the substrate, comprising:

forming the body portion on the substrate, wherein the barrier portion adjoins one end of the body portion, a thickness of the barrier portion is greater than a thickness of the body portion, and the body portion and the barrier portion are collectively referred to as the gate dielectric layer;

forming the gate electrode on the gate dielectric layer; and forming gate spacers on opposite sidewalls of the gate electrode, and removing a portion of the barrier portion to form the barrier portion with the recessed corner.

11. The method for manufacturing the semiconductor structure as claimed in claim 10, wherein after the patterned hard mask layer is etched, the hole of the patterned hard mask layer exposes a portion of a top surface of the substrate.

12. The method for manufacturing the semiconductor structure as claimed in claim 10, wherein a thermal oxidation process is performed to form the barrier portion in the hole of the patterned hard mask layer, wherein a topmost portion of the barrier portion is lower than a top surface of the patterned hard mask layer.

13. The method for manufacturing the semiconductor structure as claimed in claim 10, wherein a pad oxide layer is formed on the substrate, and the patterned hard mask layer is formed on the pad oxide layer, wherein the hole exposes the pad oxide layer after the patterned hard mask layer is etched.

14. The method for manufacturing the semiconductor structure as claimed in claim 13, wherein after the well region is formed, the method further comprises removing the pad oxide layer to expose a top surface of the substrate and a top surface of the well region.

15. The method for manufacturing the semiconductor structure as claimed in claim 10, wherein forming the gate structure comprises:

performing a thermal oxidation process to form a dielectric material layer on a top surface of the substrate and a top surface of the well region;

forming the gate electrode on the dielectric material layer, wherein a portion of the gate electrode extends to overlie a part of the barrier portion;

forming a spacer material on the dielectric material layer, wherein the spacer material covers the gate electrode; and removing a portion of the spacer material and a portion of the dielectric material layer, wherein remaining portions of the spacer material are referred to as the gate spacers and remaining portions of the dielectric material layer are referred to as the body portion.

16. The method for manufacturing the semiconductor structure as claimed in claim 10, wherein one of the gate spacers is formed on the barrier portion and adjacent to the recessed corner of the barrier portion.

17. The method for manufacturing the semiconductor structure as claimed in claim 10, wherein before etching the patterned hard mask layer, the method further comprises:

forming an isolation structure in the substrate according to the patterned hard mask layer, wherein the isolation structure is arranged to surround the well region, the gate dielectric layer and the gate electrode.

18. The method for manufacturing the semiconductor structure as claimed in claim 17, wherein a depth of the isolation structure in the substrate is greater than a depth of the barrier portion in the substrate.

19. The method for manufacturing the semiconductor structure as claimed in claim 17, wherein the isolation structure and the barrier portion include the same material.

* * * * *